United States Patent [19]

Kanaoka et al.

[11] Patent Number: 5,173,150

[45] Date of Patent: Dec. 22, 1992

[54] PROCESS FOR PRODUCING PRINTED CIRCUIT BOARD

[75] Inventors: Takeo Kanaoka; Norio Sayama, both of Tokyo, Japan

[73] Assignee: Mitsubishi Gas Chemical Co., Ltd., Tokyo, Japan

[21] Appl. No.: 689,428

[22] Filed: Apr. 23, 1991

[30] Foreign Application Priority Data

Apr. 23, 1990 [JP] Japan .................. 2-105373
Apr. 23, 1990 [JP] Japan .................. 2-105374
Apr. 23, 1990 [JP] Japan .................. 2-105375
Apr. 23, 1990 [JP] Japan .................. 2-105376

[51] Int. Cl.$^5$ .................. B44C 1/22; C23F 1/02
[52] U.S. Cl. .................. 156/630; 29/846; 29/848; 156/634; 156/650; 156/656; 156/659.1; 156/666; 156/902
[58] Field of Search ............... 156/629, 630, 634, 650, 156/652, 656, 659.1, 666, 901, 902; 427/96; 29/846, 848, 854; 361/397, 400, 401, 412, 414; 174/250, 260; 428/601, 209, 901

[56] References Cited

U.S. PATENT DOCUMENTS

| 4,404,059 | 9/1983 | Livshits et al. ............ 156/629 |
| 4,606,787 | 8/1986 | Pelligrino ............... 156/902 X |
| 4,631,100 | 12/1986 | Pellegrino ............... 156/902 X |

Primary Examiner—William A. Powell
Attorney, Agent, or Firm—Sughrue, Mion, Zinn, Macpeak & Seas

[57] ABSTRACT

A process for producing a printed circuit board which can mainly shield electromagnetic waves generated therefrom, a printed circuit board having printed thereon printed devices, a multilayered printed circuit board, or a printed circuit board for mounting chip devices, all of which have high reliability, using a printed circuit board obtained by preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more, preferably 0.3 kg/cm or more, and 90% or less of the peel strength thereof as measured after the resin is completely cured, subsequently forming a predetermined printed circuit by etching, and then pressing the resulting semicured resin-based printed circuit board, thereby to exist the conductor surface on almost the same level with the substrate surface.

12 Claims, 2 Drawing Sheets

PROCESS FOR PRODUCING PRINTED CIRCUIT BOARD

FIELD OF THE INVENTION

The present invention relates to a process for producing a printed circuit board which can mainly shield electromagnetic waves generated therefrom, a printed circuit board having printed thereon printed devices, a multilayered printed circuit board, or a printed circuit board for mounting chip devices, all of which have high reliability, using a printed circuit board obtained by preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more, preferably 0.3 kg/cm or more, and 90% or less of the peel strength thereof as measured after the resin is completely cured, subsequently forming a predetermined printed circuit by etching, and then pressing the resulting semicured resin-based printed circuit board, whereby to exist the conductor surface is on almost the same level with the substrate surface.

BACKGROUND OF THE INVENTION

As one method for the shielding of electromagnetic waves of printed circuit boards, a process for producing a printed circuit board which can mainly shield electromagnetic waves generated therefrom in a simple manner has conventionally been proposed in which a printed circuit pattern is formed by an ordinary printed circuit pattern-forming technique, an insulating layer is formed thereon over an area to be shielded, and an electrically conductive layer is then further formed thereon. In this process, the electrical insulating layer is formed by coating, printing, or otherwise applying an insulating layer-forming coating fluid and then curing the coating. However, since the copper foil pattern projects from the substrate surface, the insulating layer has a reduced thickness at portions thereof which are located on edges of the copper foil line constituting the printed circuit patterns. Therefore, formation of an electrically conductive layer which is to be a ground on such a thin insulating layer results in a reduced distance between the signal lines in the printed circuit and the ground, so that high-frequency waves tend to leak out to the ground line and, in the worst case, the result is virtually the same as an open circuit between the printed signal lines and the ground.

On the other hand, resistor-possessing printed circuit boards are produced by forming carbon resistors or the like on printed circuit boards by means of a screen printing technique, etc. In this process, a resistor ink is printed and then cured, and the resistance value is regulated by trimming, etc. Omitting this trimming step or greatly reducing the time required for this step is desirable in that production efficiency can be increased and cheaper printed circuit boards with resistors can be provided. However, it has been extremely difficult for conventional printed circuit boards to be uniformly printed with a resistor ink or the like at a desired thickness and width, since for forming a resistor, the ink should be printed on a printed circuit board's surface including gaps between the insulating substrate surface and the surface of the projecting conductor.

A multilayered printed circuit board is produced by using a printed circuit board as an inner or intermediate lamina prepared by forming a desired printed circuit pattern on a completely cured copper-clad laminate. In this process, it is necessary to use an adhesive prepreg with a prescribed impregnating resin flow in an amount about two times the desired amount, in order to completely fill the space between inner-lamina printed circuit conductors and to maintain a sufficient distance between adjacent printed circuit conductors thereby to ensure reliability. Further, according to the configuration of the printed circuit pattern, vacuum laminating is indispensable for avoiding void formation, etc. Due to these limitations, there has been a disadvantage that the conventional multilayered printed circuit board has an increased printed circuit layer distance and, as a result, thick multilayered boards can only be produced.

As methods for mounting chip devices on a printed circuit board, the following have been used. In the case of chip devices having a small number of pads, such as a resistor, capacitor, or diode, there has been a method in which a solder paste, for example, is printed or otherwise applied beforehand in a predetermined position, and the chip devices are placed thereon and the solder or the like is then melted to fix the chip devices. In the case of chip devices having a relatively large number of pads to be connected, there has, for example, been employed a method in which the chip devices are fixed to a predetermined position by means of a quick-curing adhesive or the like according to need and then secured by soldering. However, chip devices of the former type are rapidly coming to be small-sized and micro devices of about 1 mm or smaller are produced in an increasing quantity, so that fixing of such chip devices in predetermined positions is becoming difficult.

On the other hand, attention is now focused on the production of laminates by a continuous process which is intended mainly to improve the laminate production efficiency. It is necessary for this process to complete laminating within a short pressing time. However, the laminates produced by such a process, in which prepregs used in conventional daylight pressing or prepregs obtained by adding a large amount of a catalyst, etc., to such conventionally used prepregs are employed and they are completely cured by short-time pressing with the heating temperature or other conditions being changed, have the defect that the chemical resistance and other properties are inferior to the laminates produced by conventional/daylight pressing.

SUMMARY OF THE INVENTION

The present inventors have made intensive studies to overcome the above-described problems accompanying the conventional processes for producing printed circuit boards. As a result, it has been found that laminates having satisfactory properties can be obtained by modifying a continuous process for the production of laminates into a process for producing semicured resin laminates and post-curing the semicured resin laminates, and that good production efficiency can be maintained in the modified continuous process. Further studies have been made and, as a result, it has now been found that by producing a printed circuit board using the semicured resin laminate, the problems of the conventional processes for producing printed circuit boards can be easily eliminated. The present invention has been completed based on the above finding.

Accordingly, an object of the present invention is to provide a process for producing a printed circuit board which can mainly shield electromagnetic waves generated therefrom, a printed circuit board, having printed thereon printed devices, a printed circuit board of a multilayered structure or a printed circuit board for mounting chip devices.

According to one embodiment of the present invention, a process for producing a printed circuit board which can mainly shield electromagnetic waves generated therefrom is provided, which comprises (i) preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more and 90% or less of the peel strength thereof as measured after the resin is completely cured, (ii) forming a predetermined printed circuit by etching, thereby to prepare a semicured resin-based printed circuit board, (iii) pressing the semicured resin-based printed circuit board, thereby to give a printed circuit board in which the conductor surface is on almost the same level with the substrate surface, (iv) forming an electrically insulating layer in a predetermined portion of the surface of the printed circuit board, and (v) forming an electrically conductive layer as an electromagnetic wave-shielding layer on the electrical insulating layer and curing the semicured resin.

In preferred embodiments of the above process, the semicured resin-based copper-clad laminate is a laminate in which its matrix resin is an epoxy resin, and it has a semicured resin layer having a thickness of 20 $\mu$m or more between the copper foil and the base.

According to another embodiment of the present invention, a process,, for producing a printed circuit board having printed thereon printed devices is provided, which comprises (i) preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more and 90% or less of the peel strength thereof as measured after the resin is completely cured, (ii) forming a predetermined printed circuit by etching, thereby to prepare a semicured resin-based printed circuit board, (iii) pressing the semicured resin-based printed circuit board, thereby to give a printed circuit board in which the conductor surface is on almost the same level with the substrate surface, and (iv) forming printed devices in a predetermined portion of the printed circuit board.

In preferred embodiments of the above process, the semicured resin-based copper-clad laminate is a laminate in which its matrix resin is an epoxy resin, and it has a semicured resin layer having a thickness of 20 $\mu$m or more between the copper foil and the base.

According to still another embodiment of the present invention, a process for producing a multilayered printed circuit board is provided, which comprises (i) preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more and 90% or less of the peel strength thereof as measured after the resin is completely cured, (ii) forming a predetermined printed circuit by etching, thereby to prepare a semicured resin-based printed circuit board, (iii) pressing the semicured resin-based printed circuit board, thereby to give a printed circuit board for inner layer use in which the conductor surface is on almost the same level with the substrate surface, and (iv) combining the printed circuit board for inner layer use, a prepreg for interlaminar bonding, and either a copper foil or a single-side copper-clad laminate for outer layer use and laminating these.

In preferred embodiments of the above process, the semicured resin-based copper-clad laminate is a laminate in which its matrix resin is an epoxy resin, and it has a semicured resin layer having a thickness of 20 $\mu$m or more between the copper foil and the base.

According to a further embodiment of the present invention, a process for producing a printed circuit board for mounting chip devices is provided, which comprises (i) preparing a semicured resin-based copper-clad laminate by continuous pressing by means of a double-belt pressing method or a batch-wise continuous pressing in which one laminate is produced by press molding between a pair of hot platens, the semicured resin-based copper-clad laminate having a copper foil peel strength of 0.2 kg/cm or more and 90% or less of the peel strength thereof as measured after the resin is completely cured, (ii) forming a printed circuit by etching while that portion of the substrate surface on which small-sized chip devices are to be mounted is also kept being covered with the conductor foil, thereby to prepare a semicured resin-based printed circuit board, and (iii) removing, by etching, that portion of the conductor foil which is on the portion of the substrate surface on which small-sized chip devices are to be mounted.

In preferred embodiments of the above process, the semicured resin-based copper-clad laminate is a laminate in which its matrix resin is an epoxy resin, and it has a semicured resin layer having a thickness of 20 $\mu$m or more between the copper foil and the base.

BRIEF DESCRIPTION OF THE DRAWINGS

FIG. 1-$b$ is a sectional view of an electromagnetic wave-shielding printed circuit board in the case of using a conventional printed circuit board in which the conductor foil projects from the substrate surface;

FIG. 2-$b$ is a sectional view of a printed device-containing printed circuit board in the case of using a conventional printed circuit board in which the conductor foil projects from the substrate surface;

FIG. 3-b is a sectional view illustrating lamina configuration for producing a multilayered printed circuit board in the case of using a conventional printed circuit board in which the conductor foil projects from the substrate surface.

DETAILED DESCRIPTION OF THE INVENTION

Figure 1A:
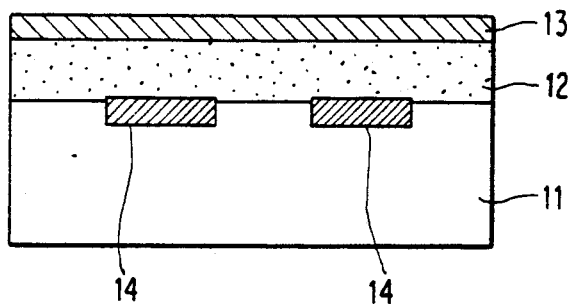
FIG. 1-$a$ is a sectional view of one example of the electromagnetic wave-shielding printed circuit board obtained by the present invention.

The semicured resin-based copper-clad laminate used in the process for producing a printed circuit board of the present invention has a copper foil peel strength of 0.2 kg/cm or more, preferably 0.3 kg/cm or more, and 90% or less of the peel strength thereof as measured after the resin is completely cured. In the case where a composition mainly comprising a thermosetting resin has been used as the matrix resin in the laminate, the glass transition temperature of the matrix resin can be a measure of the copper foil peel strength. That is, the above copper foil peel strength range corresponds to the ratio of the glass transition temperature of the matrix resin ($Tg^s$ ° C.) to the glass transition temperature of the matrix resin after complete cure ($Tg^f$ ° C.) in the range of from 0.55 to 0.90. In particular, in the case of a printed circuit pattern-forming technique using an organic solvent-based resist-stripping liquid, the preferred range of the $Tg^s/Tg^f$ ratio is about from 0.65 to 0.85. A preferred semicured resin-based copper-clad laminate is a laminate improved such that a printed circuit pattern formed is easily pushed thereinto even when the resin has a high hardness, for example, a laminate employing, for example, using a copper foil with adhesive or a resin layer-containing prepreg so as to present a 20 μm or more resin layer between the copper foil and the base, or a laminate using a nonwoven fabric prepreg at the copper foil-bonding part. Copper foil peel strength outside the above-specified range is not preferred in that if the strength is below 0.2 kg/cm, it is difficult to form a printed circuit, while if the resin in the laminate is cured to an extent such that the copper foil peel strength exceeds 90% of the peel strength as measured after complete cure, it becomes difficult to push the printed circuit into the insulating resin layer by applying heat and pressure. In the case where an epoxy prepreg for conventional daylight presses is used to prepare a semicured resin-based copper-clad laminate, the copper foil peel strength reaches 0.3 to 1.5 kg/cm (the peel strength after complete cure being 2.0 kg/cm or more) and the $Tg^s/Tg^f$ ratio becomes about 0.70 to 0.85 in 1 to 3 minute-heating at 200° C., while at 180° C., the peel strength reaches 0.4 to 1.0 kg/cm and the $Tg^s/Tg^f$ ratio becomes about 0.6 to 0.75 in 2 to 4 minutes.

A conventionally used resin can be used as the matrix resin. Examples thereof include polyester resins, epoxy resins, polyimide resins, cyanic acid ester-based resins, and the like, with epoxy resins being particularly preferred.

In the process of the present invention, a conventional semicured resin-based copper-clad laminate can be used to form a printed circuit. However, in the case where semicured resin-based copper-clad laminates prepared in the process according to the present invention are used, more strict conditions than the conventional ones can be used since the degree of cure of the resin varies very little as compared with that for conventional laminates.

The thus-prepared printed circuit board in which the conductor layer projects from the substrate resin surface is pressed to push the printed circuit conductor layer into the insulating layer.

Conditions used for pushing the conductor layer into the insulating layer may be the same as those for producing conventional flat printed boards (i.e., flush circuits). However, in the case of semicured resin-based laminates prepared in the process according to the present invention, a pressure lower than the conventionally employed pressure can be used since the laminates have a constant heat history and, hence, have a very little variation in the degree of semicured state of the resin. Further, even if the conductor layer is pushed into the insulating layer insufficiently as compared with conventional flush circuits, such a printed circuit board can be used in this invention without any particular problem. For example, a printed circuit board in which the gap between the conductor layer surface and the insulating resin substrate surface is about 10 μm or less is substantially free of the problem that an insulating coating layer to be formed has a reduced thickness.

In view of the above two advantages concerning manufacturing conditions, it is understood that the flush circuit used in the present invention can be produced at an extremely high efficiency.

Using this flat printed board, several types of printed circuit boards are produced according to the present invention.

First, in producing the electromagnetic wave-shielding printed circuit board, an electrical insulating layer is formed in a predetermined portion of the surface of the printed circuit, and an electrically conductive layer for electromagnetic wave shielding is then further formed thereon.

For forming the insulating layer, the following methods are employed: a method in which a heat-curable type insulating layer-forming coating fluid such as a coating fluid for solder resist is selectively applied to the predetermined portion by screen printing or other technique and then cured; and a method in which a photo-curable type insulating layer-forming coating fluid is applied to the whole surface of the printed circuit by dip coating, brushing, roll coating, screen printing, etc., the coating is selectively cured by exposure to light, and the uncured portion of the coating is then removed by development, etc., with the cured portion being left unremoved. The thickness of the insulating layer is a thickness such that high-frequency signals, etc., are prevented from leaking out therethrough. Because the patterned conductor is almost flush with the substrate, there is no need of taking into account that the insulating layer may have a small thickness on edges of the conductor line constituting the conductor pattern, and an insulating layer having a uniform thickness and high reliability can be formed. The electrically conductive layer for electromagnetic wave shielding is normally formed by screen printing, etc., using a conventional electrically conductive layer-forming coating fluid of the carbon-containing, copper-containing, or silver-containing type or other types. If required and necessary, other techniques such as a gas-phase plating method or an electroless plating method can be used.

The printed circuit board mounting printed devices is produced, according to the present invention, by forming a resistor or other functional part in a predetermined portion of the printed circuit by a printing technique.

As the printing technique, conventional silk screen printing or the like can be advantageously used. The coating fluid used in the printing is a fluid which gives a coating having the functions of resistor, capacitor, etc. For the printing, it is necessary to regulate the thickness, width, etc., of the printing ink applied, because this substantially eliminates the necessity of trimming, etc. It is preferred to keep the viscosity, thixotropic properties, etc., of the ink constant and to more strictly control the printing temperature, ink-feed rate, etc. It is particularly preferred that preliminary printing be conducted beforehand using model patterns having various line widths to determine the above printing conditions. Since the printed circuit board in which the conductor circuit does not project from the substrate surface is used in the process of the present invention, printing can be conducted with extremely good reproducibility, and a resistance value in a normal range and other electrical properties within acceptable ranges can be obtained by printing only.

The multilayered printed circuit board is produced by using, as an inner layer board, one or more printed circuit boards obtained above, and by combining this or these with a prepreg for interlaminar bonding and with a copper foil or a single-side copper-clad laminate for outer layer use and then laminating these. When the printed circuit conductor is pushed into the substrate, shifting of the printed circuit can be minimized by pressing the semicured resin-based laminate in a manner such that uniform pressing pressure is applied over the whole circuit surface in the direction perpendicular to the laminate plane. Further, since the printed circuit conductor has been thus pushed into the substrate, shifting of the conductor layer during laminating due to the flow of the resin in the interlaminar-bonding prepreg or due to other force is also minimized. Furthermore, since the surface of the conductor layer is on almost the same level with the substrate surface, void generation is little even when an interlaminar-bonding prepreg having a low resin flow is used, so that laminating is extremely easy.

The printed circuit board for mounting chip devices is produced by using a semicured resin-based copper-clad laminate, forming a printed circuit while the portion of the conductor foil which is on the substrate surface's portion where a small-sized chip devices are to be mounted is left unremoved, and then removing the portion of the conductor foil by etching, thereby to form a recession having a size corresponding to the amount of the etched part of the conductor foil pushed in. As a result, even if the thus-obtained printed circuit board for mounting chip devices is placed in an atmosphere which melts a paste solder or the like, chip devices can be fixed to the predetermined position without shifting.

As described above and as will be demonstrated by the following Examples, the process of the present invention enables one to produce the desired product with good reliability and other advantages, in which a printed circuit which can mainly shield electromagnetic waves generated therefrom, for printing printed devices, for inner layer use, or for mounting chip devices is formed by using a specific semicured resin-based copper-clad laminate, the printed circuit is pushed into the insulating resin substrate until the circuit surface is on almost the same level with the substrate surface thereby to prepare a flat printed board (i.e., flush circuit), and this flat printed board is then used to produce a printed circuit board which can mainly shield electomagnetic waves generated therefrom, for printing printed devices, for use as an inner layer, or for mounting chip devices.

That is, with the printed circuit board which can mainly shield electromagnetic waves generated therefrom, a printed circuit board which can mainly shield electromagnetic waves generated therefrom which has extremely good reliability can be produced according to the process of the present invention because an electrically insulating layer having a uniform thickness can be formed. In the case of the printed circuit board for printing printed devices, the desired printed part having properties very close to the initially set values can be easily produced because a coating film to be the printed devices can be formed almost uniformly at a predetermined thickness and width, so that the necessity of rectifications such as trimming can be reduced considerably. In the case of using the printed circuit board as an inner-layer board to produce a multilayered printed circuit board, laminating can be accomplished with reliability using a smaller number of interlaminar-bonding prepregs, without void formation and shifting of the inner conductor layer due to the flow of the prepreg resin. Further, by the use of the printed circuit board for mounting chip devices, fixing of, in particular, a small-sized chip devices to a predetermined position can be easily attained with good precision.

Therefore, the processes of the present invention for producing printed circuit boards, particularly which can shield electromagnetic waves generated therefrom and printing printed devices, are of considerable industrial significance.

The present invention is explained below in more detail by reference to the following Examples, which should not be construed to be limiting the scope of the invention.

EXAMPLE 1

Figure 1B:
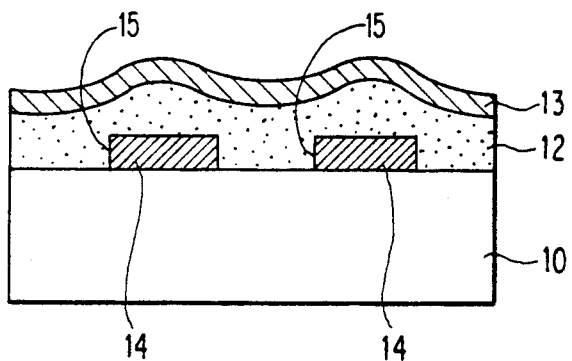

FIG. 1-$a$ is a sectional view of one example of the electromagnetic wave-shielding printed circuit board obtained by a process of the present invention using a flat printed board, while FIG. 1-$b$ is a sectional view of an electromagnetic wave-shielding printed circuit board employing a conventional printed circuit board in which the conductor foil projects from the substrate surface.

For use in the production of the electromagnetic wave-shielding printed circuit board as shown in FIG. 1-$a$, a semicured resin-based copper-clad laminate was obtained as follows.

Three nonwoven glass fabric-based epoxy resin prepregs obtained using a nonwoven glass fabric (100 g/m$^2$) were superposed on one another and sandwiched between two woven glass fabric-based epoxy resin prepregs, and this assembly was further sandwiched between two copper foils, as the outermost layers, each copper foil having a thickness of 35 μm. The resulting assembly was continuously fed to a double-belt press, and laminating was conducted at a temperature of 200° C. and a pressure of 50 kg/cm$^2$ for 1 minute, thereby obtaining a semicured resin-based copper-clad laminate having a copper foil peel strength of 0.85 kg/cm and a glass transition temperature of 92° C. (136° C. after complete cure).

On this semicured resin-based copper-clad laminate, a printed circuit pattern (14) was formed by etching. The resulting semicured resin-based printed circuit board was then pressed at a temperature of 170° C. and an areal pressure of 75 kg/cm$^2$ to obtain a flat printed board (11). The above etching could be conducted without any trouble such as peeling of the pattern due to poor adhesion thereof, and the gap between the surface of the conductor pattern pushed in and the substrate surface was 5 μm or less.

Subsequently, an insulating layer (12) having a thickness of 60 μm was formed by screen printing on a predetermined portion of the above-obtained flat printed board, and then semi-cured by heating. Thereafter, an electrically conductive layer-forming coating fluid was printed likewise at a thickness of 30 μm on the semi-cured insulating layer and then cured, thereby forming an electromagnetic wave-shielding layer (13).

In the thus-obtained electromagnetic wave-shielding printed circuit board, the insulating layer had been formed uniformly and the electrically conductive layer had also been formed extremely uniformly.

On the other hand, the electromagnetic wave-shielding printed circuit board as shown in FIG. 1-b was produced as follows. An insulating layer (12) having a thickness of 60 μm was formed by screen printing on a predetermined portion of a conventional printed circuit board (10), and then semi-cured by heating. Subsequently, an electrically conductive layer-forming coating fluid was printed likewise at a thickness of 30 μm and then cured, thereby forming an electromagnetic wave-shielding layer (13). In this case, there are 35 μm gaps (15) between the surface of the printed circuit pattern (14) and the surface of the insulating substrate. Because of this, the insulating layer-forming coating fluid applied almost uniformly over the predetermined portion of the printed circuit board surface flows to the recessions on the insulating substrate surface, i.e., to the recessed portions surrounded by the projecting conductor lines constituting the printed circuit. It can be understood that in some cases, the insulating layer thus formed has a very small thickness around edges of the conductor lines constituting the printed circuit. Further, it can also be easily understood that pinholes or other defects tend to occur in some cases around such edges because uniform coating is difficult due to the presence of gaps.

EXAMPLE 2

Figure 2A:
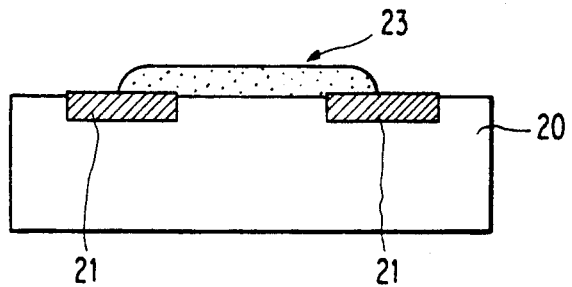
FIG. 2-$a$ is a sectional view of one example of the printed device-containing printed circuit board obtained by the present invention.
Figure 2B:
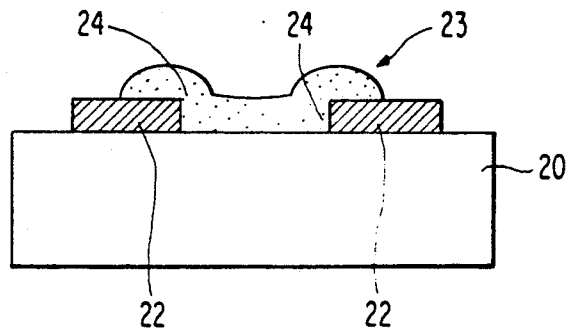

FIG. 2-a is a sectional view of one example of the printed resistor-mounting printed circuit board obtained by a process of the present invention using a flat printed board, while FIG. 2-b is a sectional view of a printed resistor-mounting printed circuit board employing a conventional printed circuit board in which the conductor foil projects from the substrate surface.

The printed circuit board of FIG. 2-a was obtained as follows. First, a flat printed board (21) having a predetermined conductor pattern was prepared in the same manner as in Example 1.

Subsequently, a resistor ink (23) was applied by screen printing on a predetermined portion of the above-obtained flat printed board and then cured by heating, thereby forming resistors.

In the thus-obtained printed circuit board mounting resistors, the resistors had been formed extremely uniformly in thickness and width, and its resistance value fluctuations were well within ±10% of the set value.

On the other hand, the printed circuit board of FIG. 2-b was obtained by applying a resistor ink (23) by screen printing on a predetermined portion of a conventional printed circuit board (20) and curing the coating by heating, thereby forming resistors.

In this case, there are 35 μm gaps (24) between the surface of the printed circuit pattern (22) and the surface of the insulating substrate. Because of this, the layer of the resistor ink applied almost uniformly over the predetermined portion of the printed circuit board surface deforms on the recessions on the insulating substrate surface, so that the resulting resistor coating varies not only in thickness but also in width, etc. These variations are subtly affected by the desired width and thickness of the resistor coating, the thickness of the conductor foil, the degree of overlapping with the conductor foil, and other factors. It was therefore necessary to conduct trimming.

EXAMPLE 3

Figure 3A:
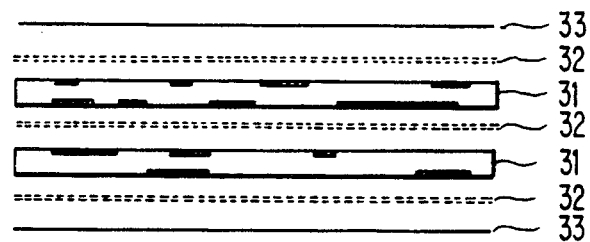
FIG. 3-a is a sectional view illustrating one example of lamina configuration for producing a multilayered printed circuit board according to the present invention.
Figure 3B:
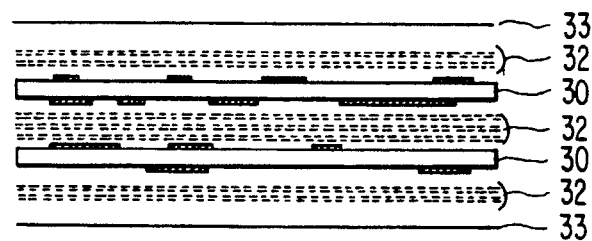

FIG. 3-a is a sectional view illustrating one example of lamina configuration for a multilayered printed circuit board employing a flat printed board and produced by a process of this invention, while FIG. 3-b is a sectional view illustrating lamina configuration in the case of using a conventional printed circuit board in which the conductor foil projects from the substrate surface.

The flat printed board (31) shown in FIG. 3-a was obtained as follows. Three 0.2 mm-thick woven glass fabric-based epoxy resin prepregs were superposed on one another and sandwiched between two 35 μm-thick copper foils. The resulting assembly was continuously fed to a double-belt press, and laminating was conducted at a temperature of 200° C. and a pressure of 50 kg/cm$^2$ for 1 minute, thereby obtaining a semicured resin-based copper-clad laminate having a copper foil peel strength of 0.85 kg/cm and a glass transition temperature of 92° C. (136° C. after complete cure). On this semicured resin-based copper-clad laminate, a printed circuit pattern was formed by etching. The resulting semicured resin-based printed circuit board was then pressed at a temperature of 170° C. and an areal pressure of 75 kg/cm$^2$ to obtain a flat printed board (31) for inner layer use. The above etching could be conducted without any trouble such as peeling of the pattern due to poor adhesion thereof. Further, the pressing to push the conductor pattern into the substrate could be conducted without substantial shifting of the conductor pattern, and the gap between the pattern surface and the substrate surface was from 5 to 10 μm.

Two of the thus-obtained flat printed boards were superposed on each other through a 0.2 mm-thick woven glass fabric-based epoxy resin prepreg (32) for interlaminar bonding, and this assembly was sandwiched between two outer-layer-use copper foils (33) as the outermost layers through one epoxy resin prepreg of the above kind on both sides. The resulting assembly was pressed at a temperature of 170° C. and a pressure of 40 kg/cm$^2$ for 90 minutes, thereby preparing a 6-layered shielded board.

The thus-obtained multilayered shielded board was examined for void generation, the distance between the inner conductor layers, etc., and as a result, the product was ascertained to be good.

In the case of using a conventional printed circuit board (30) for inner layer use in which the conductor layer projects from the substrate surface, as shown in FIG. 3-b, it is necessary to insert three 0.2 mm-thick woven glass fabric-based epoxy resin prepregs between the two inner-layer printed circuit boards (30—30) and two such prepregs between an outer-layer copper foil and each of the printed circuit boards. Furthermore, vacuum laminating should be conducted in order to avoid occurrence of defects such as voids.

EXAMPLE 4

Figure 4:
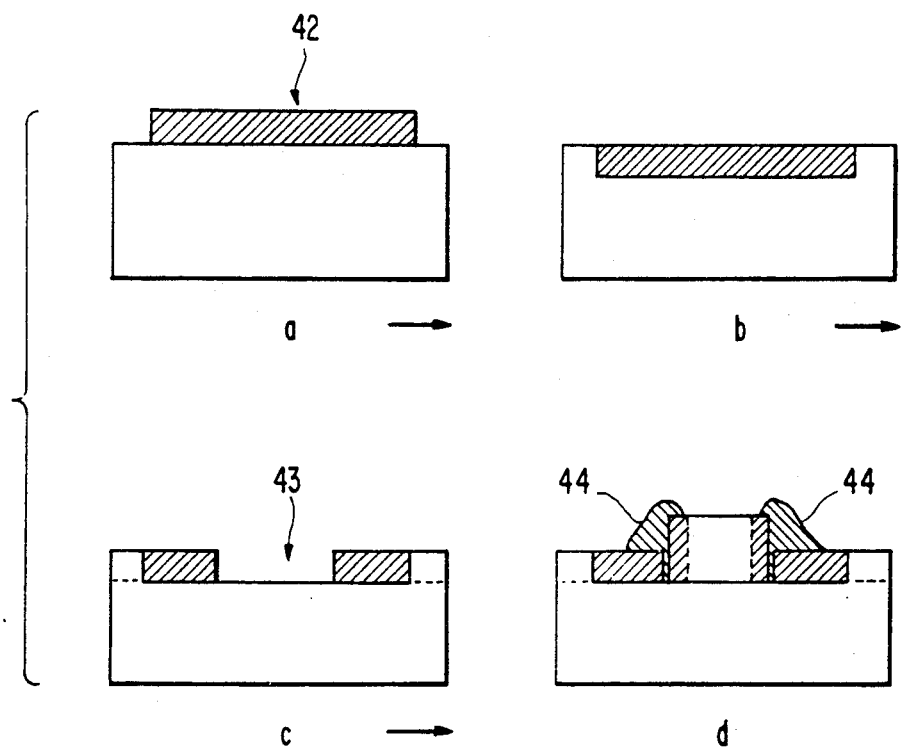
FIGS. 4(a–d) are sectional views illustrating the flow of the steps in the process for producing a printed circuit board, of the present invention which is for mounting chip devices and has a recessed area where chip devices are to be mounted, and the step of fixing chip devices to the recessed area in the printed circuit board.

FIG. 4 is sectional views illustrating the flow of the steps in the process for producing a printed circuit board of the present invention which is for mounting chip devices and has a recessed area where chip devices are is to be mounted, and the step of fixing chip devices to the recessed area in the printed circuit board.

Referring to FIG. 4, the process is explained below. Three nonwoven glass fabric-based epoxy resin prepregs obtained by using a nonwoven glass fabric (100 g/m²) were superposed on one another and sandwiched between two woven glass fabric-based epoxy resin prepregs, and this assembly was further sandwiched between two copper foils, as the outermost layers, each foil having a thickness of 35 μm. The resulting assembly was continuously fed to a double-belt press, and laminating was conducted at a temperature of 200° C. and a pressure of 50 kg/cm² for 1 minute, thereby obtaining a semicured resin-based copperclad laminate having a copper foil peel strength of 0.85 kg/cm and a glass transition temperature of 92° C. (136° C. after complete cure). On this semicured resin-based copper-clad laminate, a printed circuit pattern (42) was formed by etching, while the portion of the substrate surface on which small-sized chip devices are to be mounted was kept being covered with the copper foil (FIG. 4-a). The resulting semicured resin-based printed circuit board was then pressed at a temperature of 170° C. and an areal pressure of 75 kg/cm² to push the pattern into the substrate, thereby obtaining a flat printed board (FIG. 4-b). The above etching could be conducted without any trouble such as peeling of the pattern due to poor adhesion thereof, and the gap between the surface of the conductor pattern pushed in and the substrate surface was 5 μm or less.

Subsequently, the portion of the conductor foil in the above-obtained flat printed board which was on the substrate's portion where small-sized chip devices were to be mounted was removed by etching, thereby forming chip device-mounting area (43) (FIG. 4-c).

Chip devives were then placed on the chip device-mounting area and fixed with a solder (44) (FIG. 4-d).

It was ascertained that in the above step in which chip devices are placed and soldered, there is no fear of the trouble that the chip devices shift from its predetermined position.

While the invention has been described in detail and with reference to specific embodiments thereof, it will be apparent to one skilled in the art that various changes and modifications can be made therein without departing from the spirit and scope thereof.

What is claimed is:

1. A process for producing a printed circuit board which can mainly shield electromagnetic waves generated therefrom, which comprises
   (i) preparing a semicured resin-based copper-clad laminate by continuous pressing by means of a double-belt pressing method or by batch-wise continuous pressing in which one laminate is produced by press molding between a pair of hot platens, said semicured resin-based copper-clad laminate having a copper foil peel strength of 0.2 kg/cm or more and 90% or less of the peel strength thereof as measured after the resin is completely cured,
   (ii) forming a predetermined printed circuit by etching, thereby to prepare a semicured resin-based printed circuit board,
   (iii) pressing the semicured resin-based printed circuit board, thereby to give a printed circuit board in which the conductor surface is on almost the same level with the substrate surface,
   (iv) forming an electrically insulating layer in a predetermined portion of the surface of the printed circuit board, and
   (v) forming an electrically conductive layer as an electromagnetic wave-shielding layer on the electrical insulating layer and curing the semicured resin.

2. A process as claimed in claim 1, wherein said semicured resin-based copper-clad laminate is a laminate in which its matrix resin is an epoxy resin.

3. A process as claimed in claim 2, wherein said semicured resin-based copper-clad laminate has a semicured resin layer having a thickness of 20 μm or more between the copper foil and the base.

4. A process for producing a printed circuit board printing printed devices, which comprises
   (i) preparing a semicured resin-based copper-clad laminate by continuous pressing by means of a double-belt pressing method or by batch-wise continuous pressing in which one laminate is produced by press molding between a pair of hot platens, said semicured resin-based copper-clad laminate having a copper foil peel strength of 0.2 kg/cm or more and 90% or less of the peel strength thereof as measured after the resin is completely cured,
   (ii) forming a predetermined printed circuit by etching, thereby to prepare a semicured resin-based printed circuit board,
   (iii) pressing the semicured resin-based printed circuit board, thereby to give a printed circuit board in which the conductor surface is on almost the same level with the substrate surface, and
   (iv) forming printed devices in a predetermined portion of the printed circuit board.

5. A process as claimed in claim 4, wherein said semicured resin-based copper-clad laminate is a laminate in which its matrix resin is an epoxy resin.

6. A process as claimed in claim 5, wherein said semicured resin-based copper-clad laminate has a semicured resin layer having a thickness of 20 μm or more between the copper foil and the base.

7. A process for producing a multilayered printed circuit/board, which comprises
   (i) preparing a semicured resin-based copper-clad laminate by continuous pressing by means of a double-belt pressing method or by batch-wise continuous pressing in which one laminate is produced by press molding between a pair of hot platens, said semicured resin-based copper-clad laminate having a copper foil peel strength of 0.2 kg/cm or more and 90% or less of the peel strength thereof as measured after the resin is completely cured, (ii) forming a predetermined printed circuit by etching, thereby to prepare a semicured resin-based printed circuit board, (iii) pressing the semicured resin-based printed circuit board, thereby to give a printed circuit board for inner layer use in which the conductor surface is on almost the same level with the substrate surface, and (iv) combining the printed circuit board for inner layer use, a prepreg for interlaminar bonding, and either a copper foil or a single-side copper-clad laminate for outer layer use and laminating these.

8. A process as claimed in claim 7, wherein said semicured resin-based copper-clad laminate is a laminate in which its matrix resin is an epoxy resin.

9. A process as claimed in claim 8, wherein said semicured resin-based copper-clad laminate has a semicured resin layer having a thickness of 20 μm or more between the copper foil and the base.

10. A process for producing a printed circuit board for mounting chip devices, which comprises (i) preparing a semicured resin-based copper-clad laminate by continuous pressing by means of a double-belt pressing method or by batch-wise continuous pressing in which one laminate is produced by press molding between a pair of hot platens, said semicured resin-based copper-clad laminate having a copper foil peel strength of 0.2 kg/cm or more and 90% or less of the peel strength thereof as measured after the resin is completely cured, (ii) forming a printed circuit by etching while that portion of the substrate surface on which small-sized chip devices are to be mounted is also kept being covered with the conductor foil, thereby to prepare a semicured resin-based printed circuit board, and, (iii) removing, by etching, the portion of the conductor foil which is on said portion of the substrate surface on which small-sized chip devices are to be mounted.

11. A process as claimed in claim 10, wherein said semicured resin-based copper-clad laminate is a laminate in which its matrix resin is an epoxy resin.

12. A process as claimed in claim 11, wherein said semicured resin-based copper-clad laminate has a semicured resin layer having a thickness of 20 μm or more between the copper foil and the base.

* * * * *